(12) United States Patent
Aoki et al.

(10) Patent No.: US 7,828,628 B2
(45) Date of Patent: Nov. 9, 2010

(54) METHOD OF POLISHING HARD CRYSTAL SUBSTRATE

(75) Inventors: Kenji Aoki, Tokyo (JP); Toru Yamazaki, Tokyo (JP); Takehiro Watanabe, Tokyo (JP); Naoyuki Hamada, Tokyo (JP)

(73) Assignee: NIHON Micro Coating Co., Ltd., Tokyo (JP)

( * ) Notice: Subject to any disclaimer, the term of this patent is extended or adjusted under 35 U.S.C. 154(b) by 406 days.

(21) Appl. No.: 11/946,531

(22) Filed: Nov. 28, 2007

(65) Prior Publication Data

US 2008/0139089 A1 Jun. 12, 2008

(30) Foreign Application Priority Data

Dec. 1, 2006 (JP) .............................. 2006-326334

(51) Int. Cl.
*B24B 7/22* (2006.01)
(52) U.S. Cl. .......................................... 451/41; 451/37
(58) Field of Classification Search .................. 451/36, 451/37, 57, 58, 41
See application file for complete search history.

(56) References Cited

U.S. PATENT DOCUMENTS

| 5,207,759 | A  | * | 5/1993 | Mehmandoust et al. | ........ 451/63 |
| 5,942,015 | A  | * | 8/1999 | Culler et al. | .................. 51/295 |
| 7,374,473 | B2 | * | 5/2008 | Kumasaka et al. | ............ 451/36 |
| 7,585,341 | B2 | * | 9/2009 | Kumasaka et al. | ............ 51/307 |
| 2007/0010098 | A1 | * | 1/2007 | Brusic et al. | ................. 438/692 |
| 2008/0200098 | A1 | * | 8/2008 | Moeggenborg et al. | ....... 451/37 |

* cited by examiner

*Primary Examiner*—Robert Rose
(74) *Attorney, Agent, or Firm*—Weaver Austin Villeneuve & Sampson LLP

(57) ABSTRACT

A hard crystal substrate such as a GaN substrate or a SiC substrate is polished by using polishing oil slurry having abrading particles of artificial diamond clusters dispersed in a dispersant. The artificial diamond clusters include approximately spherical agglomerate particles with average particle size D50 of 20 nm or more and 50 nm or less, having primary particles with particle diameters of 2 nm or more and 10 nm or less. A rough polishing process is carried out first such that an average surface roughness of 0.5 nm or more and 1 nm or less is obtained, followed by a finishing process such that the average surface roughness of said surface becomes 0.2 nm or less.

8 Claims, 19 Drawing Sheets

METHOD OF POLISHING HARD CRYSTAL SUBSTRATE

This application claims priority on Japanese Patent Application 2006-326334 filed Dec. 1, 2006.

BACKGROUND OF THE INVENTION

This invention relates to a method of polishing a hard crystal substrate such as gallium nitride (GaN) and silicon carbide (SiC) substrates.

GaN (Group III nitride semiconductor) and crystalline material of SiC are wide band-gap semiconductors, and a GaN substrate is usually manufactured by forming a GaN film on a sapphire substrate by a halide vapor phase epitaxy (HVPE) method, as disclosed in Japanese Patent Publication Tokkai 9-335580. Devices may be formed on this GaN film, for example, to produce a short-wavelength green or blue light-emitting elements and a purple-color semiconductor laser. On the other hand, SiC is coming to be used as the substrate of a high-function power device since it can be used in high-output, high-frequency and high-temperature operations and has a high insulation breakdown field.

Since GaN substrates and SiC substrates are hard crystal substrates and since devices of specified kinds are formed on the surface of such a hard crystal substrate, high levels of flatness and smoothness are required of such surfaces.

Conventional methods of polishing the surface of such a hard crystal substrate were to use free polishing particles, initially carrying out a rough polishing process by using somewhat larger abrading particles and reducing stepwise the size of the abrading particles such that the substrate surface will become flat and smooth, as disclosed in Japanese Patent Publication Tokkai 2001-322899.

Polishing by free abrading particles is carried out by rotating a metallic lapping plate, supplying polishing slurry on the surface of this lapping plate, pressing the surface of a substrate held by a work holder onto the surface of the lapping plate and causing this work holder to rotate. In conventional polishing methods by free abrading particles, aqueous slurry with abrading particles dispersed in an aqueous dispersant has been used.

In conventional polishing methods by free abrading particles, furthermore, the technical problem has been to reduce the required polishing time, and the limit reachable by such methods has been to polish the target surface of a substrate to an average surface roughness (Ra) of about 0.4 nm. By such a conventional polishing method, however, unwanted scratch lines are formed, as shown in FIG. 16A, and it is presently not possible to sufficiently mirror-polish the surface of a hard crystal substrate.

SUMMARY OF THE INVENTION

It is therefore an object of this invention to provide a method of polishing the surface of a hard crystal substrate to a mirror surface with average surface roughness of 0.2 nm or less.

Polishing oil slurry of this invention may be characterized as comprising abrading particles including artificial diamond clusters and an oil dispersant for dispersing these abrading particles, and the hard crystal substrate to be polished may be a GaN or SiC substrate.

In the above, the artificial diamond clusters comprise approximately spherical agglomerate particles with average particle diameter D50 of 20 nm or more and 50 nm or less, having primary particles with particle diameters of 2 nm or more and 10 nm or less. The oil dispersant includes synthetic isoparaffin hydrocarbons.

The method of this invention for polishing a hard crystal substrate is characterized as comprising a rough polishing process of polishing a surface of the substrate such that it will come to have an average surface roughness (Ra) of 0.5 nm or more and 1 nm or less and a finishing process, carried out after the rough polishing process, of polishing the substrate surface such that its average surface roughness (Ra) becomes 0.2 nm or less.

In the above, the finishing process comprises the steps of rotating a lapping plate, supplying the polishing oil slurry of this invention described above to a surface of this lapping plate, pressing the surface of the hard crystal substrate onto the surface of the lapping plate and rotating the hard crystal substrate. The lapping plate comprises a soft metal such as tin or its alloy, having a groove formed thereon. The groove is preferably spiral, centered around the axis of rotation of the lapping plate and being sectionally V-shaped.

The rough polishing process preferably comprises a first rough polishing step of polishing the surface of the hard crystal substrate such that its average surface roughness (Ra) becomes 1 nm or more and 3 nm or less and a second rough polishing step, carried out after the first rough polishing step, of polishing the substrate surface such that its average surface roughness (Ra) becomes 0.5 nm or more and 1 nm or less.

The merit of the invention is that the surface of a hard crystal substrate can be mirror-polished so as to have an average surface roughness (Ra) of 0.2 nm or less without forming any scratches.

DETAILED DESCRIPTION OF THE INVENTION

Figure 1:
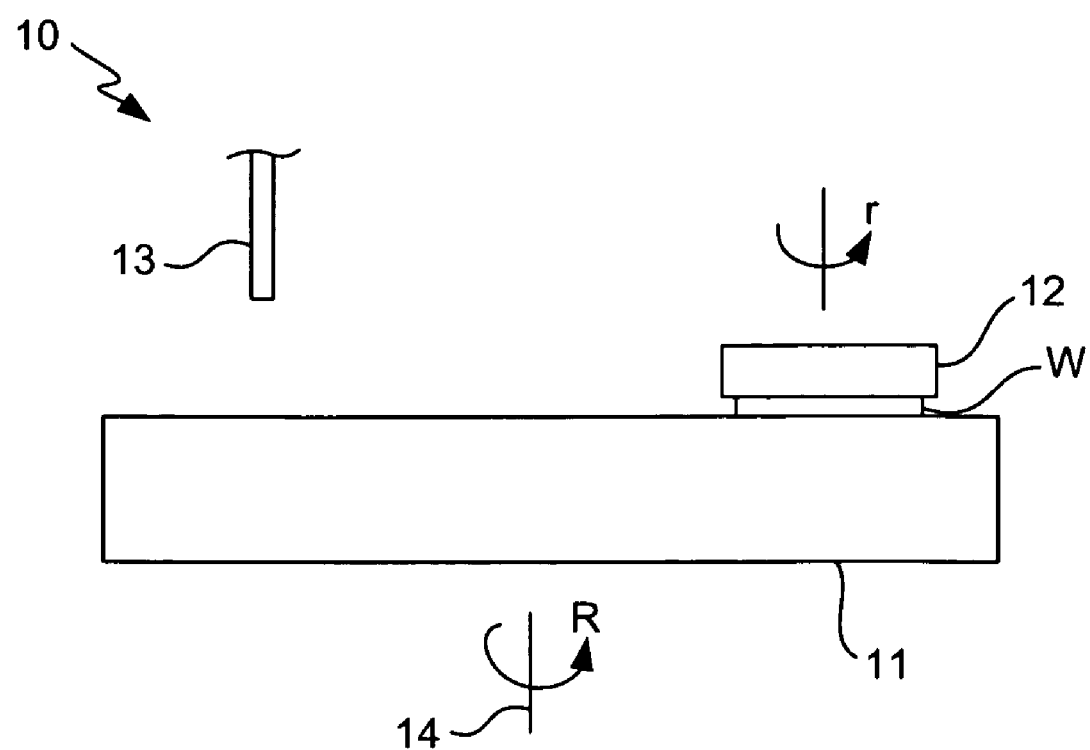
FIG. 1 is a side view of an apparatus for pad-less polishing.

The invention relates to polishing oil slurry for and a method of polishing a hard crystal substrate which may preferably be a GaN substrate or a SiC substrate.

Polishing oil slurry of this invention comprises abrading particles and an oil dispersant that disperses these abrading particles, and the abrading particles according to this invention include artificial diamond clusters.

The oil dispersant according to this invention includes oils, having the function of forming an oily film on the surfaces of the abrading particles and improving the particle lubricity on the target surface to be polished. Examples of the oil include paraffin hydrocarbons and may preferably include synthesized isoparaffin hydrocarbons.

The oil dispersants according to this invention include non-ionic surfactants as dispersants for improving dispersion of abrading particles and preferably include higher aliphatic monoglycerides or higher aliphatic diglycerides.

The artificial diamond clusters according to this invention comprise approximately spherical agglomerate particles with average size D50 of 20 nm or more and 50 nm or less, having primary particles with particle diameters of 2 nm or more and 10 nm or less. Since the particle size distribution of the abrading particles dispersed in an oil dispersant cannot be measured, the average particle size D50 of the artificial diamond clusters is shown here by the measured value of the dispersion inside pure water.

The artificial diamond clusters of this invention comprise artificial diamond obtained by an explosion synthesis method (also known as a shockwave method) of a known kind. There are two kinds of explosion synthesis method. One is to use graphite powders as the material for diamond and to compress these graphite powders at a high temperature by providing a shock with the energy of explosion to thereby generate diamond artificially. The other method is to explode an explosive such as TNT or RDX and to artificially convert the carbon (as the material for diamond) contained in the explosive into diamond by the shock caused by the energy of explosion.

Since the reaction product that is obtained by such an explosion synthesis method contains carbon materials that have not reacted as well as metallic impurities, such obtained product is chemically treated with nitric acid, sulfuric acid, hydrochloric acid or a mixture thereof to dissolve and remove these impurities. After the impurities are removed, water is used for washing.

The artificial diamond thus obtained comprises primary particles and agglomerate particles of these primary particles. The diameters of the primary particles are within the range of 2 nm-20 nm, and they have the shape with more roundness than monocrystalline and polycrystalline diamond particles. Diamond films that have not reacted and diamond-like carbon films are formed on the surfaces of the primary particles. The agglomerate particles are formed as the primary particles agglomerate into a nearly spherical shape at the time of the explosion synthesis, and these agglomerate particles are referred to as artificial diamond clusters.

Artificial diamond clusters are more easily breakable than agglomerate particles obtained by agglomerating natural (monocrystalline and polycrystalline) diamond particles within a liquid. In other words, if artificial diamond clusters are pressed to the surface of a target object to be polished, those of larger sizes break up to an appropriate degree such that the number of scratches formed by artificial diamond clusters can be reduced.

If the size of artificial diamond clusters is too large, however, the surface of the target object to be polished is polished too deeply as the clusters break up, and this may result in unwanted scratches. Since the average surface roughness of the target surface to be polished is 0.2 nm or less according to this invention, artificial diamond particles exceeding 50 nm are excluded. For this purpose, the product obtained by the explosion synthesis method is crushed by means of a ball mill or the like, the aforementioned chemical treatment is carried out, it is washed with water and then a centrifugal separator is used for sorting to collect artificial diamond particles of a desired size.

Polishing oil slurry of this invention is produced by mixing oil with a dispersant and causing artificial diamond clusters to be dispersed in this liquid mixture. The amount of the dispersant to be used is 1 weight % or more and 10 weight % or less with respect to the whole of the oil. The amount of the artificial diamond cluster is 0.1 weight % or more and 3 weight % or less with respect to the whole of the polishing oil slurry.

The method of this invention for polishing a hard crystal substrate comprises a rough polishing process for polishing a surface of the hard crystal substrate such that the average surface roughness (Ra) of the surface becomes 0.5 nm or more and 1 nm or less and a finishing process for polishing the surface after the rough polishing process such that its average surface roughness (Ra) becomes 0.2 nm or less.

The target surface of the hard crystal substrate is polished in the rough polishing process such that the surface waviness (Wa) becomes 1 nm or less. This is because the correction of the surface waviness becomes difficult in the subsequent finishing process if it exceeds 1 nm because the stock removal is small during the finishing process.

The rough polishing process is carried out by a known method of tape polishing, pad polishing or pad-less polishing such that the average surface roughness (Ra) of the target surface of the hard crystal substrate becomes 0.5 nm or more and 1 nm or less.

The tape polishing method is carried out by rotating the substrate attached to a spindle, supplying polishing slurry on the surface of this substrate, pressing a tape of a woven or non-woven cloth or a foamed material and causing it to run. The pad polishing method is carried out by rotating a lapping plate with a pad of a woven or non-woven cloth or a foamed material adhered to its surface, supplying polishing slurry to the surface of this pad, pressing the surface of the substrate thereto and causing it to rotate.

The pad-less polishing method may be carried out by using an apparatus 10 shown in FIG. 1, rotating its lapping plate 11 in the direction of arrow R with no pad on its surface, supplying polishing slurry through a nozzle 13 directly to the surface of the lapping plate 11, pressing the surface of the substrate W held by a work holder 12 onto the surface of the lapping plate 11 and rotating the work holder 12 in the direction of arrow r.

In the above, the polishing slurry may be water-based or oil-based, having abrading particles dispersed in a water-based or oil-based dispersing medium.

The abrading particles may be particles of polycrystalline diamond, monocrystalline diamond, aluminum oxide ($Al_2O_3$), silicon oxide ($SiO_2$), chromium oxide ($Cr_2O_3$) or cubic boron nitride (cBN). Of the above, polycrystalline diamond particles are preferable.

Examples of water-based dispersing medium include water and aqueous solutions obtained by adding a dispersing agent such as glycols and alcohols to water. Examples of oil-based dispersing medium include oils and those obtained by adding a dispersing agent such as paraffin hydrocarbons to oil.

The rough polishing process may consist of a single step or two or more steps of rough polishing process. If the target average surface roughness (Ra) (of 0.5 nm or more and 1 nm or less) is to be attained by a single step of rough polishing process, it will take a long time and the surface waviness (Wa) becomes large. If the rough polishing process includes three or more steps, on the other hand, the process becomes too cumbersome.

According to a preferred embodiment of this invention, the rough polishing process consists of a first step of polishing the target surface of a hard crystal substrate such that its average surface roughness (Ra) becomes 1 nm or more and 3 nm or less and a second step of polishing (carried out after the first step) the target surface such that its average surface roughness (Ra) becomes 0.5 nm or more and 1 nm or less).

In the first of the rough polishing steps, the hard crystal substrate is subjected to tape polishing, pad polishing or pad-less polishing (such as shown in FIG. 1) by using water-based or oil-based polishing slurry containing abrading particles (preferably comprising polycrystalline diamond particles) with average size D50 of 3 μm or more and 5 μm or less.

In the second rough polishing step, the hard crystal substrate is subjected to tape polishing, pad polishing or pad-less polishing by using water-based or oil-based polishing slurry containing abrading particles (preferably comprising polycrystalline diamond particles) with average size D50 of 0.5 μm or more and 3 μm or less.

Figure 2A:
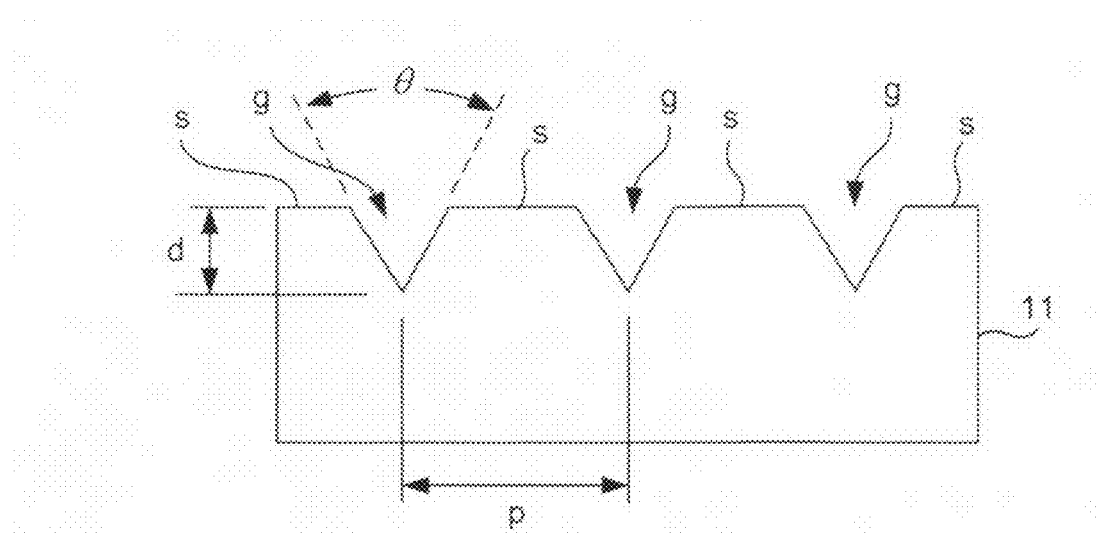
FIG. 2A is a schematic sectional view of a lapping plate used in the rough polishing process.
Figure 2B:
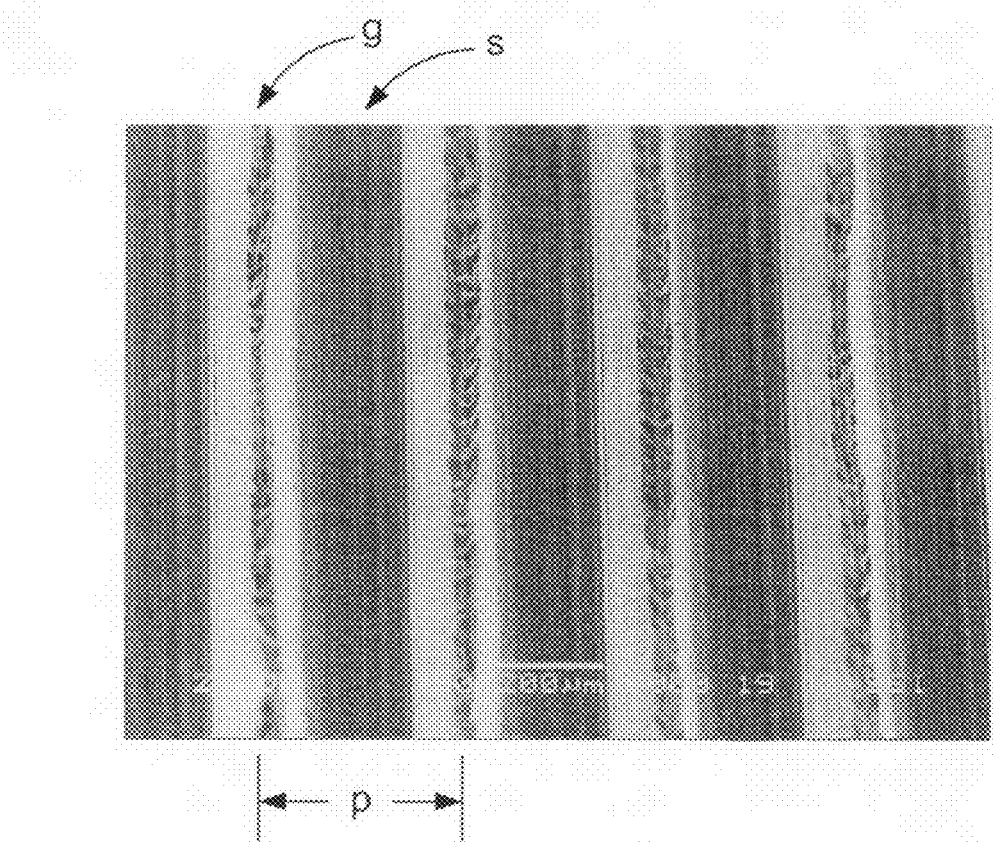
FIG. 2B is an enlarged photograph of a portion of its surface.

Pad-less polishing is particularly preferred both for the first and second rough polishing steps. The lapping plate to be used in such pad-less polishing process is shown in FIG. 2. This lapping plate 11 is made of a soft metallic material (such as tin or a tin alloy), and spiral grooves (shown by symbol g) with depth (indicated by symbol d) in the range of 50 μm-100 μm are formed on the surface (shown by symbol s) with average surface roughness (Ra) of 10 nm-50 nm, having a center matching the axis of rotation (shown at 14 in FIG. 1). These grooves (g) are sectionally V-shaped with the inner surfaces having a slope θ within the range of 30°-90°. The pitch (indicated by symbol p) of the grooves (g) is 0.2 mm-0.5 mm.

In the finishing process, the target surface of the hard crystal substrate is subjected to a pad-less processing process (as shown in FIG. 1), inclusive of the steps of rotating the lapping plate 11 in the direction of arrow R, supplying polishing oil slurry of this invention through the nozzle 13 to the surface of the lapping plate 11, pressing the surface of the hard crystal substrate W held by the work holder 12 onto the surface of the lapping plate 11 and rotating the work holder 12 holding the hard crystal substrate W in the direction of arrow r.

Figure 3A:
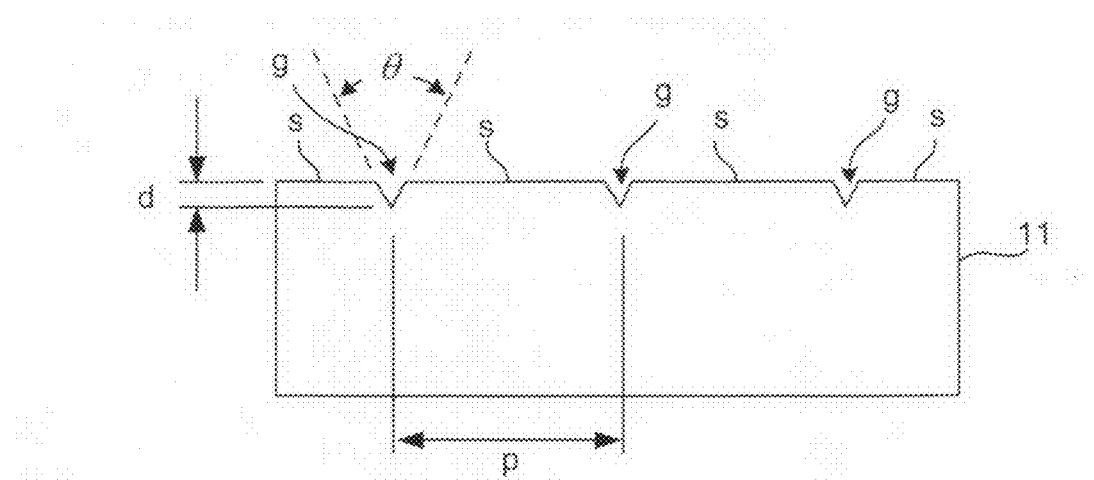
FIG. 3A is a schematic sectional view of a lapping plate used in the finishing process.
Figure 3B:
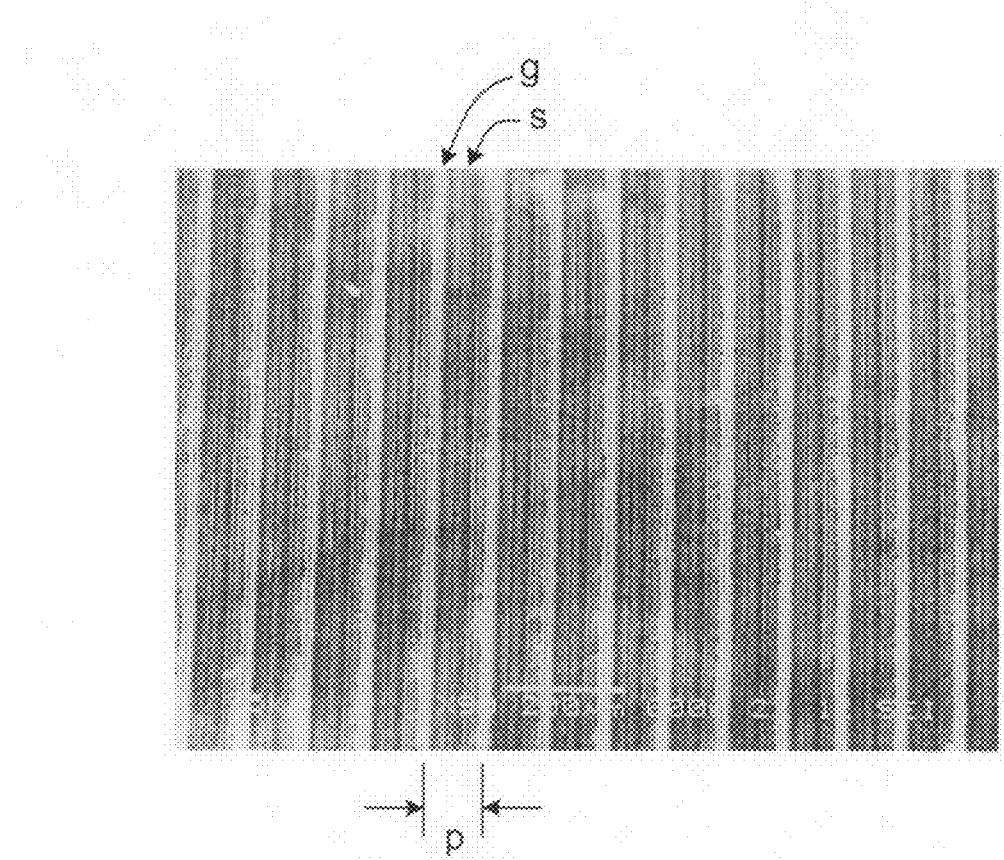
FIG. 3B is an enlarged photograph of a portion of its surface.

FIG. 3 (consisting of FIGS. 3A and 3B) shows the lapping plate 11 used in this finishing process, made of a soft metallic material (such as tin or a tin alloy). Spiral grooves (shown by symbol g) with depth (indicated by symbol d) in the range of 15 μm-30 μm are formed on the surface (shown by symbol s) with average surface roughness (Ra) of 10 nm-50 nm, having a center matching the axis of rotation (shown at 14 in FIG. 1). These grooves (g) are sectionally V-shaped with the inner surfaces having a slope θ within the range of 30°-90°. The pitch (indicated by symbol p) of the grooves (g) is 0.05 mm-0.2 mm.

The invention is described next by way of test and comparison examples.

TEST EXAMPLE 1

Polishing oil slurry with composition as shown in Table 1 below was used in Test Example 1 to carry out a finishing process on a GaN substrate with diameter=2 inches.

TABLE 1

| Abrading particles | Artificial diamond clusters: Diameter of primary particles = 4 nm-10 nm Average size of agglomerate particles D50 = 27 nm | | 0.5 weight % |
|---|---|---|---|
| Oil-based dispersing medium | Oil | Synthetic isoparaffin hydrocarbons | 95.5 weight % |
| | Dispersing agent | Non-ionic surfactant (higher aliphatic monoglyceride | 4.0 weight % |

In the above, the artificial diamond clusters were those manufactured by the explosion synthesis method, including approximately spherically shaped agglomerate particles with average size D50=27 nm with primary particles of diameters in the range of 4 nm-10 nm.

Figure 6:
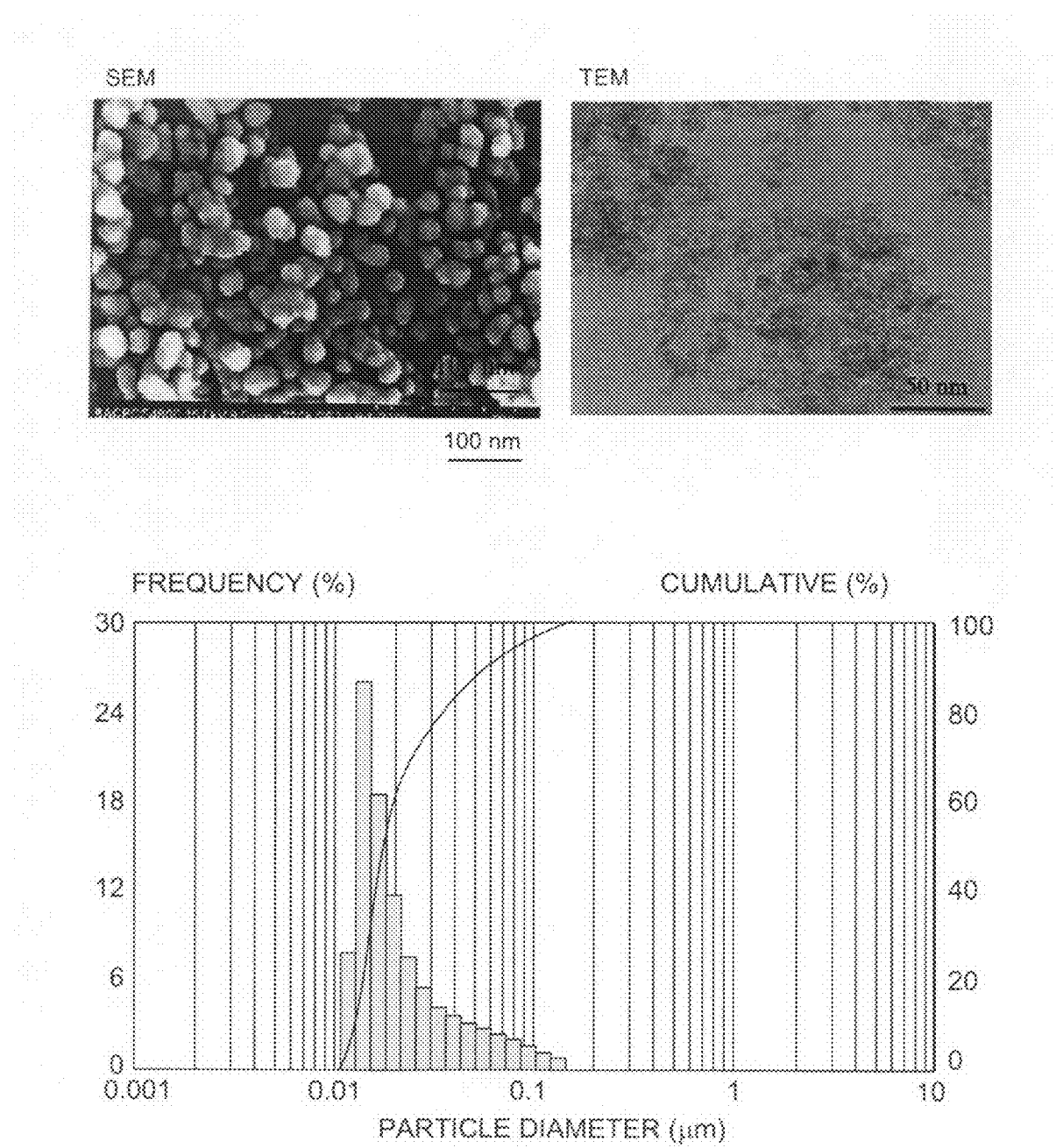
FIG. 6 is a graph of particle size distribution of the artificial diamond clusters with average size of 27 nm in the polishing oil slurry of Test Example 1 and their microscopic (SEM and TEM) photographs.

Since the particle size distribution of the abrading particles dispersed in the oil dispersant cannot be measured, the average particle size D50 of the artificial diamond clusters is shown here by the measured value of the dispersion inside pure water. The measurement was made with a commercially available apparatus for the measurement of particle size distribution (Product name: UPA-150 produced by Nikkiso Kabushiki Kaisha). FIG. 6 shows a graph of particle size distribution of the artificial diamond clusters in the polishing oil slurry of Test Example 1 and their microscopic (SEM and TEM) photographs.

The first rough polishing step was carried out by the pad-less polishing method. The lapping plate was rotated and polishing slurry was supplied to its surface. The surface of a GaN substrate held by the work holder was pressed onto the surface of the lapping plate and the work holder was rotated to carry out the first rough polishing of the target surface. The conditions of this process were as shown in Table 2 below.

TABLE 2

| | |
|---|---|
| Rotational speed of lapping plate | 60 rpm |
| Rotational speed of work holder | 40 rpm |
| Polishing pressure | 0.5 kg/cm$^2$ |
| Supply rate of slurry | 3 ml/minute |
| Polishing time   First rough polishing | 40 minutes |
| Second rough polishing | 40 minutes |
| Finishing | 60 minutes |

After the first rough polishing step, paraffin hydrocarbons were used to wash away the abrading particles and the GaN substrate was washed and rinsed with alcohols. Thereafter, the average surface roughness (Ra) and the surface waviness (Wa) of the surface of the GaN substrate were measured by means of a commercially available measurement apparatus (Product name: NewView 5000 produced by Zygo Company) under the conditions shown in Table 3 below.

TABLE 3

| | Average surface roughness (Ra) | Surface waviness (Wa) |
|---|---|---|
| Magnification of object lens | ×10 | ×10 |
| Magnification of intermediate lens | ×0.8 | ×0.8 |
| High pass filter | 0.05 mm | — |
| Band pass filter | — | 0.05 mm-0.5 mm |

A tin plate of diameter 15 inches was used as the lapping plate with its surface polished so as to have the average surface roughness of 20 nm and spiral grooves formed thereon with the center matching the axis of its rotation. The grooves were sectionally V-shaped with a depth of 100 μm and having inner surface sloped at an angle of 60°. The pitch of the grooves was 0.3 mm.

Figure 4:
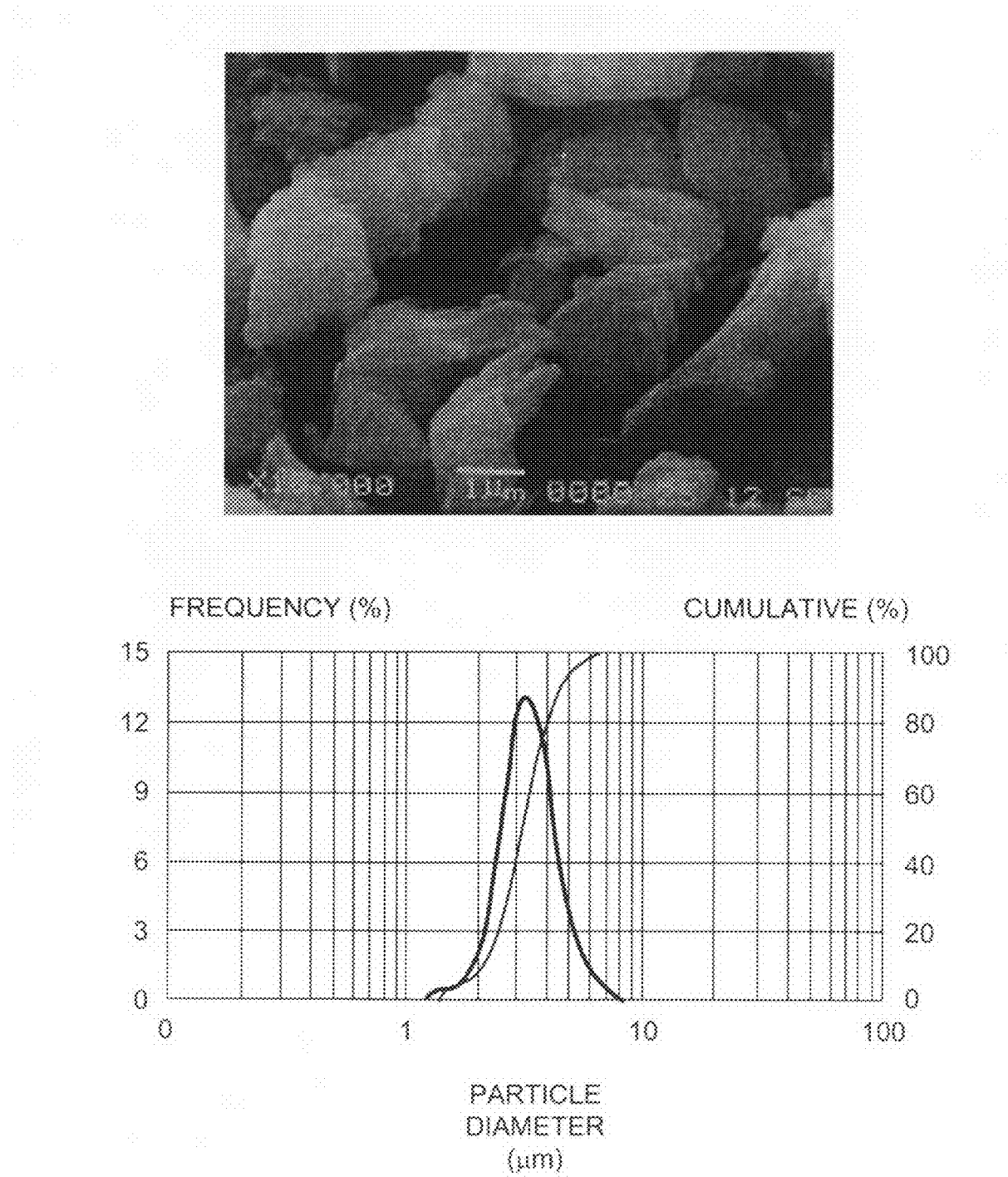
FIG. 4 is a graph of particle size distribution of artificial diamond particles used in the first rough polishing step of Test Examples 1 and 2 and their microscopic (SEM) photograph.

The polishing slurry was as described in Table 4 below, having polycrystalline diamond particles with average size D50 of 3 μm dispersed in an oil dispersant. FIG. 4 shows a graph of particle size distribution of these artificial diamond particles and their microscopic (SEM) photograph.

TABLE 4

| Abrading particles | Polycrystalline diamond particles: Average particle size D50: 3 μm | 0.5 weight % |
|---|---|---|
| Oil dispersant | Oil   Synthetic isoparaffin hydrocarbons | 95.5 weight % |
| | Dispersant   Non-ionic surfactant (higher aliphatic monoglycerides) | 4.0 weight % |

The second rough polishing step was also carried out by the pad-less polishing method. As in the first rough polishing step, the lapping plate was rotated, polishing slurry was supplied to its surface, the surface of the GaN substrate held by the work holder was pressed onto the surface of the lapping plate and the work holder was rotated so as to carry out the second rough polishing process. FIG. 2 also shows the conditions of this second rough polishing step.

After this second rough polishing step, paraffin hydrocarbons were used again, as was the case after the first rough polishing step, to wash away the abrading particles, alcohols are used to rinse the GaN substrate, and the average surface roughness (Ra) and the surface waviness (Wa) of the GaN substrate were measured by using a commercially available apparatus for the measurement (Product name: NewView 5000 produced by Zygo Company) under the conditions shown in Table 3 below.

Figure 5:
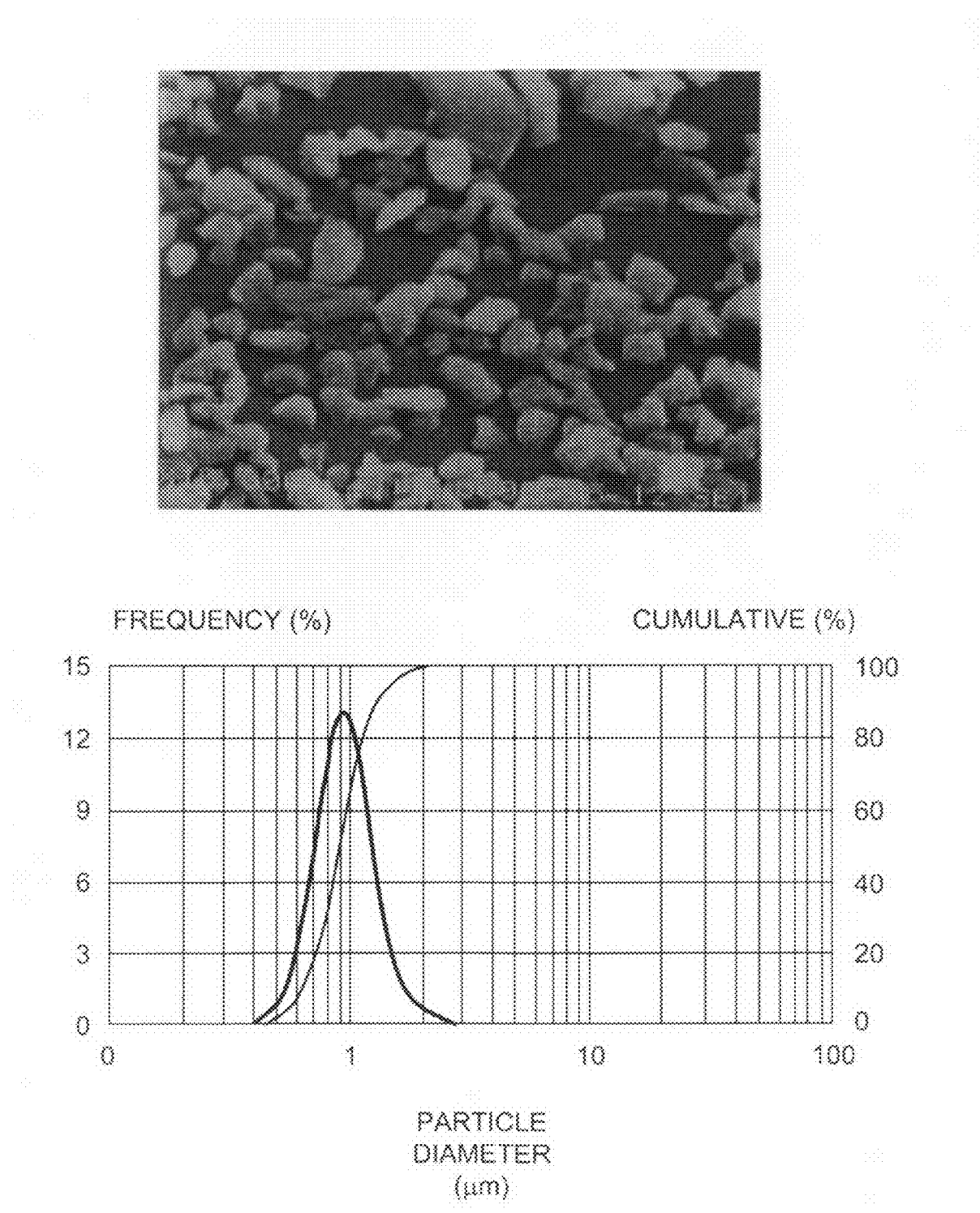
FIG. 5 is a graph of particle size distribution of artificial diamond particles used in the second rough polishing step of Test Examples 1 and 2 and their microscopic (SEM) photograph.

The same lapping plate as used in the first rough polishing was used also for the second rough polishing. The polishing slurry was as described in Table 5 below, having polycrystalline diamond particles with average size D50 of 1 μm dispersed in an oil dispersant of the same kind as used for the first rough polishing step. FIG. 5 shows a graph of particle size distribution of these artificial diamond particles and their microscopic (SEM) photograph.

TABLE 5

| Abrading particles | Polycrystalline diamond particles: Average particle size D50: 1 μm | 0.5 weight % |
|---|---|---|
| Oil dispersant | Oil   Synthetic isoparaffin hydrocarbons | 95.5 weight % |
| | Dispersant   Non-ionic surfactant (higher aliphatic monoglycerides) | 4.0 weight % |

The finishing step was also carried out by the pad-less polishing method. As in the first and second rough polishing steps, the lapping plate was rotated, polishing slurry was supplied to its surface, the surface of the GaN substrate held by the work holder was pressed onto the surface of the lapping plate and the work holder was rotated so as to carry out the finishing process. Table 2 also shows the conditions of this finishing step.

A tin plate of diameter 15 inches was used as the lapping plate with its surface polished so as to have the average surface roughness of 20 nm and spiral grooves formed thereon with the center matching the axis of its rotation. The grooves were sectionally V-shaped with a depth of 20 μm and having inner surface sloped at an angle of 60°. The pitch of the grooves was 0.1 mm.

After this finishing step, paraffin hydrocarbons were used again to wash off the abrading particles, alcohols were used for rinsing the GaN substrate and the average surface roughness (Ra) and the surface waviness (Wa) of the GaN substrate were measured by using a commercially available apparatus for the measurement (Product name: NewView 5000 produced by Zygo Company) under the conditions shown in Table 3 above.

COMPARISON EXAMPLE 1

Figure 7:
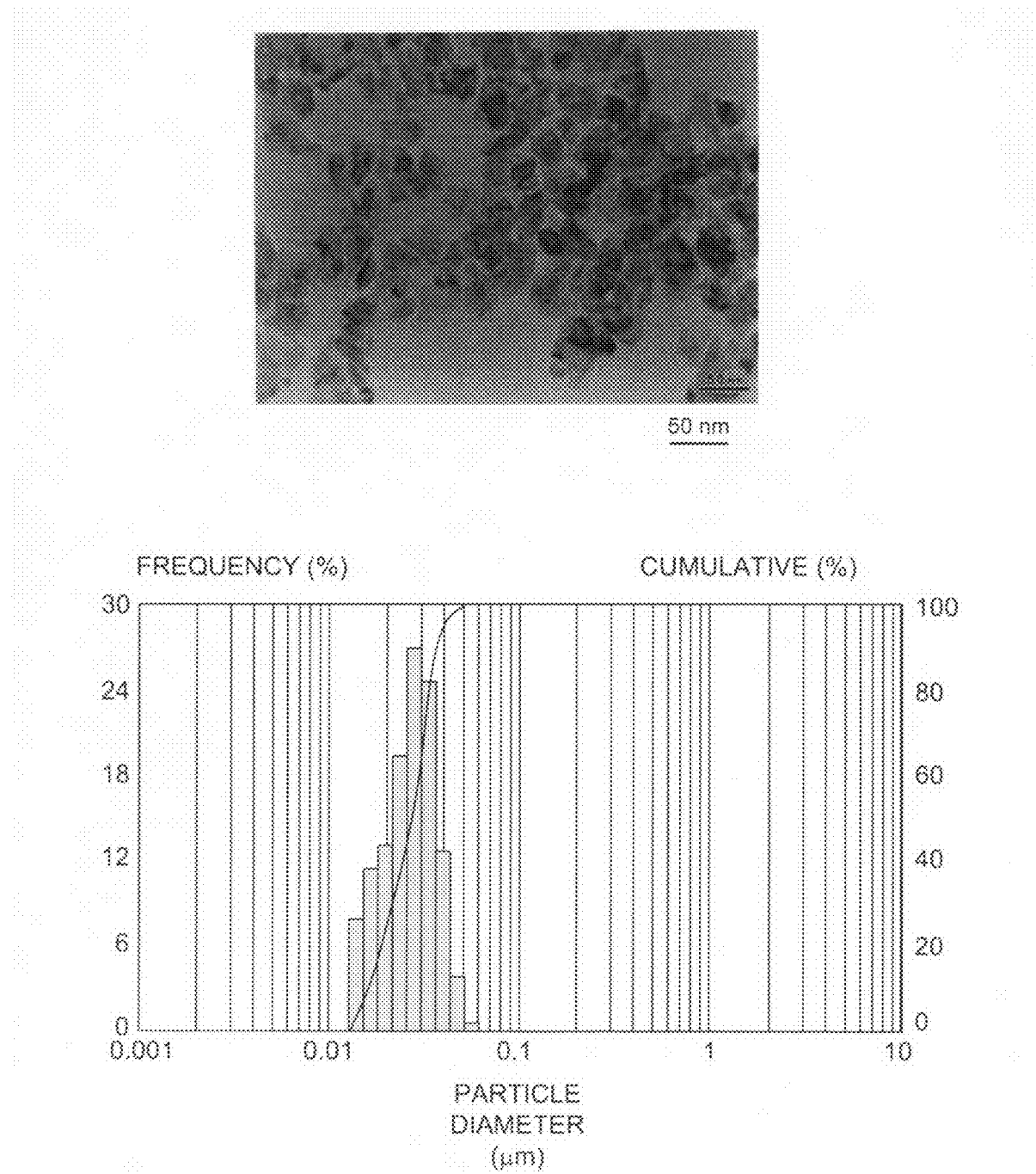
FIG. 7 is a graph of particle size distribution of the artificial diamond clusters with average size of 30 nm in the polishing oil slurry of Comparison Example 1 and their microscopic (TEM) photograph.

Polishing oil slurry of Comparison Example 1 contains as abrading particles polycrystalline diamond particles with nearly the same average size D50 of 30 nm as the artificial diamond clusters of Test Examples 1. The composition of polishing oil slurry of Comparison Example 1 is shown in Table 6 below. FIG. 7 shows a graph of particle size distribution of the artificial diamond particles in the polishing oil slurry of Comparison Example 1 and their microscopic (SEM and TEM) photographs. This polishing oil slurry of Comparison Example 1 was used to carry out the finishing process on a GaN substrate of diameter 2 inches.

TABLE 6

| Abrading particles | Polycrystalline diamond particles: Average particle size D50: 30 μm | | 0.5 weight % |
|---|---|---|---|
| Oil dispersant | Oil | Synthetic isoparaffin hydrocarbons | 95.5 weight % |
| | Dispersant | Non-ionic surfactant (higher aliphatic monoglycerides) | 4.0 weight % |

In the above, as was the case in Test Example 1 discussed above, since the particle size distribution of the abrading particles dispersed in the oil dispersant cannot be measured, the average particle size D50 of the artificial diamond clusters is shown here by the measured value of the dispersion inside pure water. The measurement was made with a commercially available apparatus for the measurement of particle size distribution (Product name: UPA-150 produced by Nikkiso Kabushiki Kaisha).

In the firsts rough polishing step, the same lapping plate and the same polishing oil slurry (described in Table 4) described above for the first rough polishing step of Test Example 1 were used under the same conditions described in Table 2 to polish the GaN substrate by the pad-less method. After the first rough polishing step, paraffin hydrocarbons were used to wash off the abrading particles, alcohols were used to rinse the GaN substrate, and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

In the second rough polishing step, the same lapping plate and the same polishing oil slurry (described in Table 5) described above for the second rough polishing of Test Example 1 were used under the same conditions described in Table 2 to polish the GaN substrate by the pad-less method. After the second rough polishing step, paraffin hydrocarbons were used to wash off the abrading particles, alcohols were used to rinse the GaN substrate, and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

The finishing process was also carried out by the pad-less polishing method as for the finishing process in Test Example 1. The same lapping plate used for the finishing process in Test Example 1 was rotated, the polishing oil slurry of Comparison Example 1 was supplied to its surface, the surface of the GaN substrate held by the work holder was pressed onto the surface of the lapping plate, and the work holder was rotated to carry out the finishing process on the GaN substrate under the conditions described in Table 2. After the finishing step, paraffin hydrocarbons were used to wash off the abrading particles, alcohols were used to rinse the GaN substrate, and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

COMPARISON EXAMPLE 2

Polishing slurry of Comparison Example 2 is water-based and contains artificial diamond clusters of Test Examples 1 as abrading particles. The composition of the polishing slurry of Comparison Example 2 is shown in Table 7 below. This slurry was produced by mixing a dispersant with water, adding abrading particles to this liquid mixture (water-based dispersant) and dispersing the abrading particles in this water-based dispersant by using a homogenizer. A GaN substrate of diameter 2 inches was subjected to a finishing process by using this water-based polishing slurry. It is to be noted that polishing oil slurry was used in the first and second rough polishing steps of Test Example 1 and Comparison Example 1 but water-based polishing slurry was used in the first and second rough polishing steps of Comparison Example 2.

TABLE 7

| Abrading particles | Artificial diamond clusters of Test Example 1 | | 0.5 weight % |
|---|---|---|---|
| Water-based dispersant | Pure water | | 55 weight % |
| | Dispersant | Polyethylene glycol 400 | 16.8 weight % |
| | | Polyethylene glycol 2000 | 23 weight % |
| | | Ethylene glycol | 5 weight % |
| | | Glycerol | 0.2 weight % |

In the first rough polishing step of Comparison Example 2, the same lapping plate for the first rough polishing step of Test Example 1 was used under the same conditions described in Table 2 to polish a GaN substrate by the pad-less method. After the first rough polishing step, the GaN substrate was rinsed with pure water and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

Water-based polishing slurry having 0.5 weight % of polycrystalline diamond particles with average size D50 of 3 μm dispersed in pure water was used. FIG. 4 shows a graph of particle size distribution of these polycrystalline diamond particles and their microscopic (SEM) photograph.

In the second rough polishing step, the same lapping plate described above for the second rough polishing of Test Example 1 was used under the same conditions described in Table 2 to polish the GaN substrate by the pad-less method. After the second rough polishing step, the GaN substrate was rinsed with pure water and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

Water-based polishing slurry having 0.5 weight % of polycrystalline diamond particles with average size D50 of 1 μm dispersed in pure water was used. FIG. 5 shows a graph of particle size distribution of these polycrystalline diamond particles and their microscopic (SEM) photograph.

The finishing process was also carried out by the pad-less polishing method as for the finishing process in Test Example 1. The same lapping plate used for the finishing process in Test Example 1 was rotated, the polishing oil slurry of Comparison Example 2 was supplied to its surface, the surface of the GaN substrate held by the work holder was pressed onto the surface of the lapping plate, and the work holder was rotated to carry out the finishing process on the GaN substrate under the conditions described in Table 2. After the finishing step, the GaN substrate was rinsed with pure water and the average surface roughness (Ra) and the surface waviness (Wa) of the GaN substrate were thereafter measured by using a commercially available apparatus for the measurement (Product name: NewView 5000 produced by Zygo Company) under the conditions shown in Table 3 above.

Figure 8A:
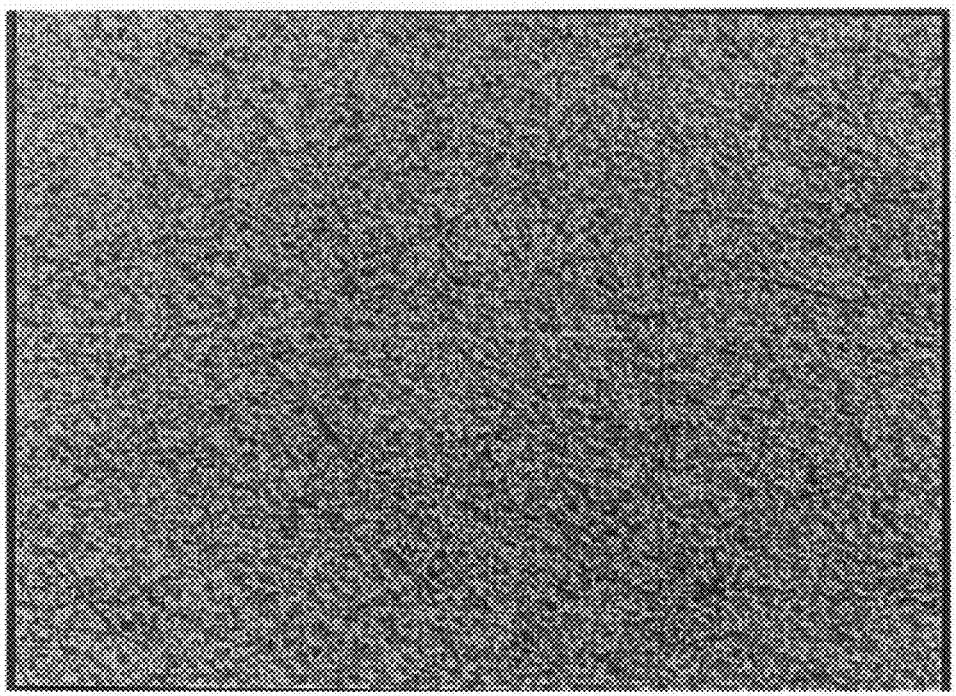
FIG. 8 includes FIGS. 8A and 8B which are respectively an enlarged photograph of a plan view and a diagonal view of the surface of the GaN substrate after the first rough polishing step of Test Example 1.
Figure 8B:
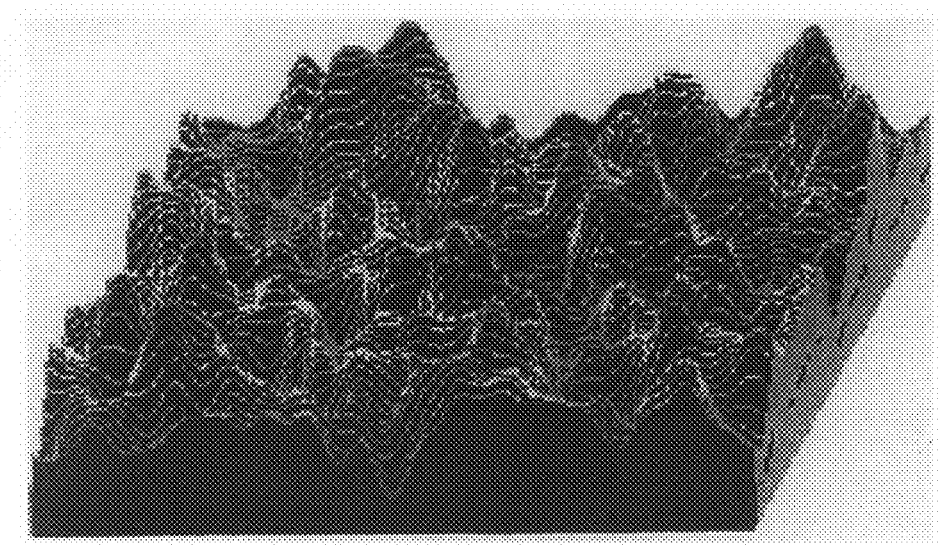
Figure 9A:
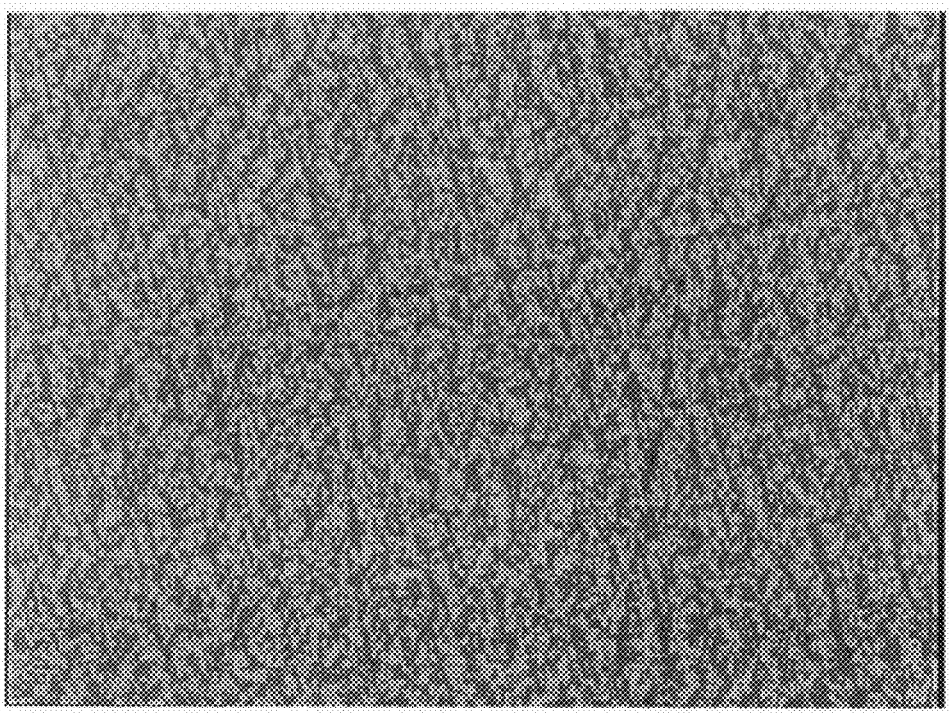
FIG. 9 includes FIGS. 9A and 9B which are respectively an enlarged photograph of a plan view and a diagonal view of the surface of the GaN substrate after the second rough polishing step of Test Example 1.
Figure 9B:
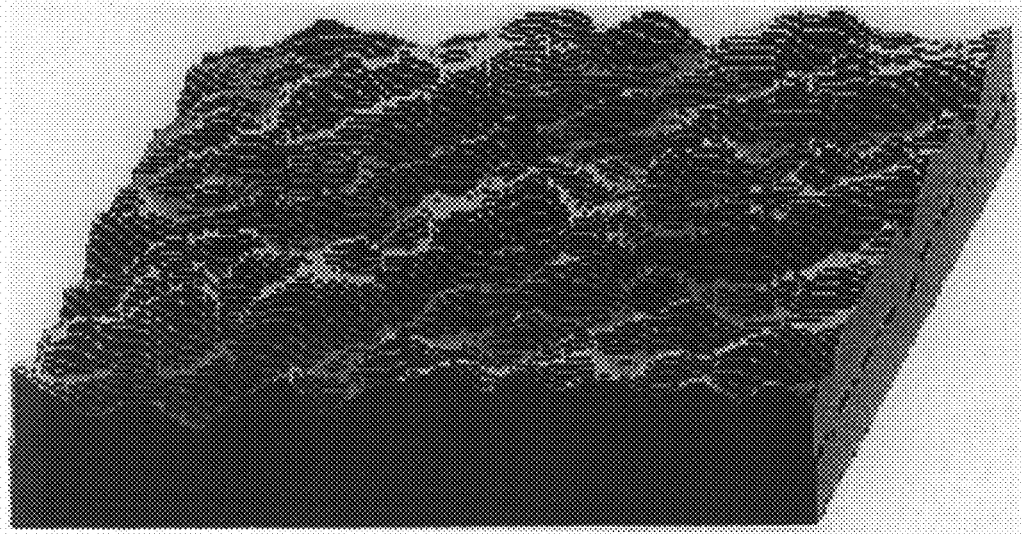
Figure 11A:
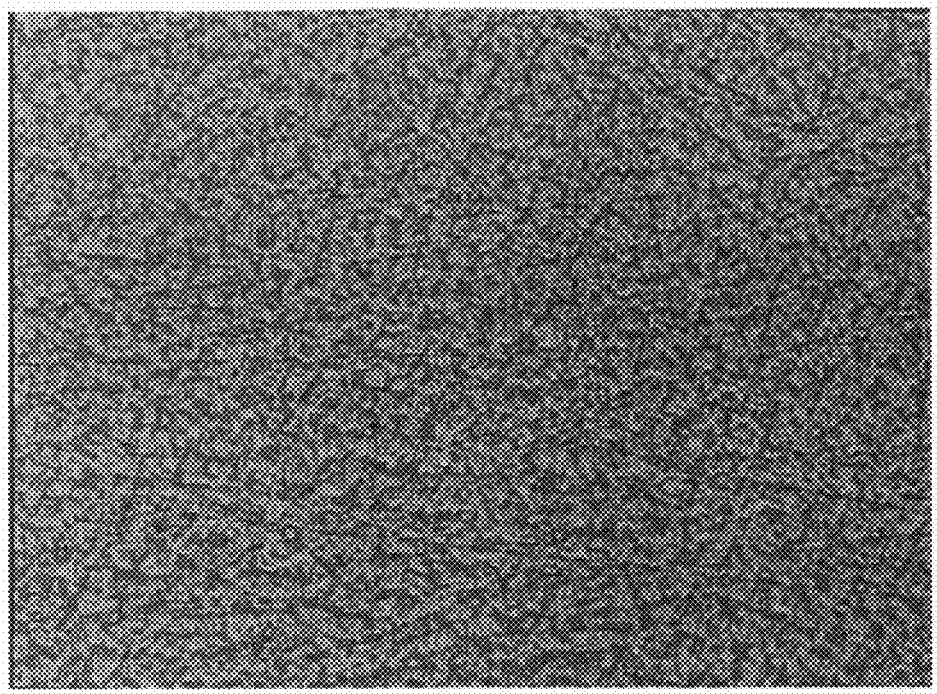
FIG. 11 includes FIGS. 11A and 11B which are respectively an enlarged photograph of a plan view and a diagonal view of the surface of the GaN substrate after the first rough polishing step of Comparison Example 1.
Figure 11B:
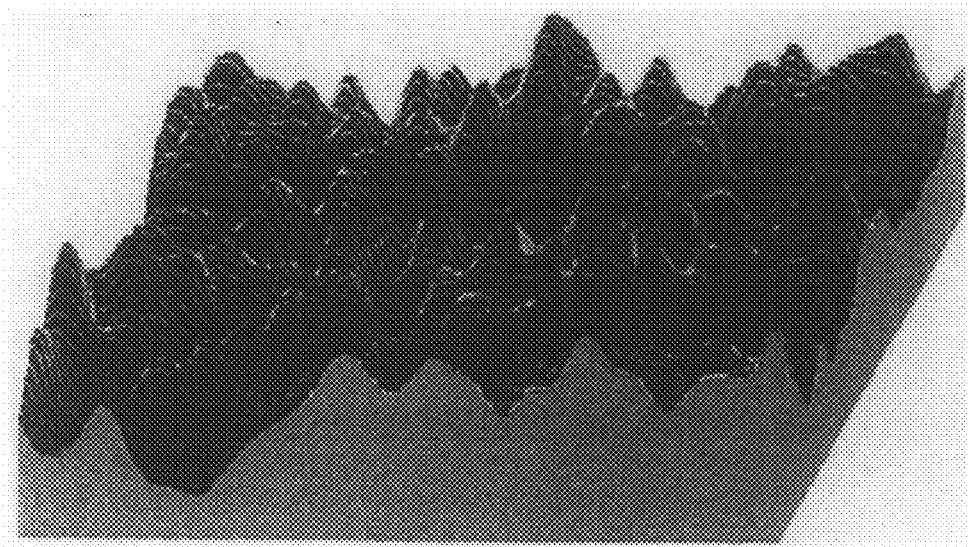
Figure 12A:
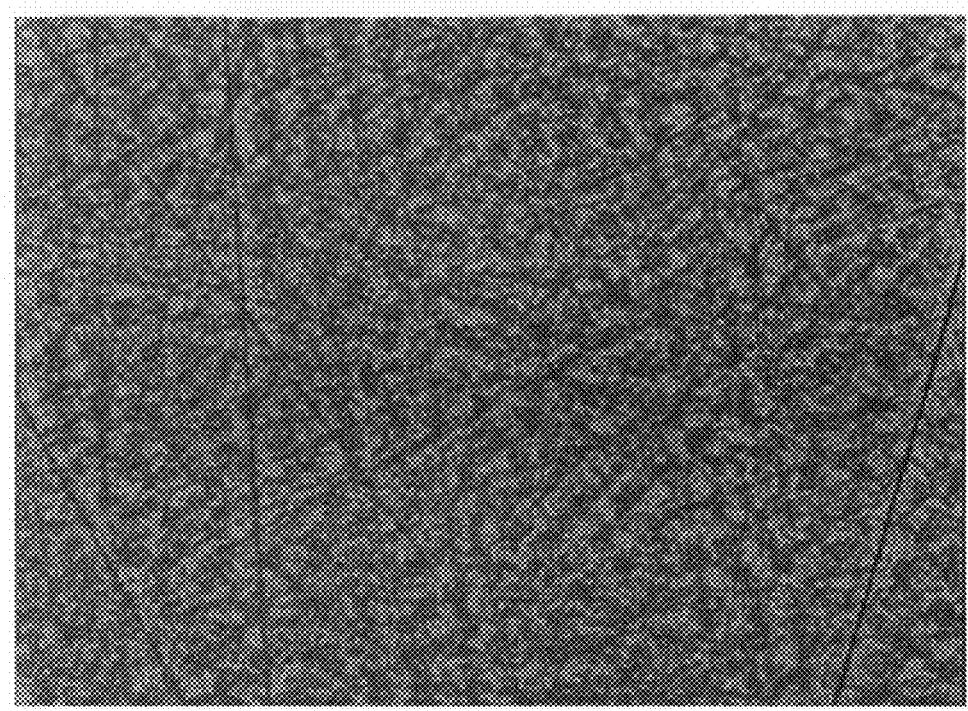
FIG. 12 includes FIGS. 12A and 12B which are respectively an enlarged photograph of a plan view and a diagonal view of the surface of the GaN substrate after the second rough polishing step of Comparison Example 1.
Figure 12B:
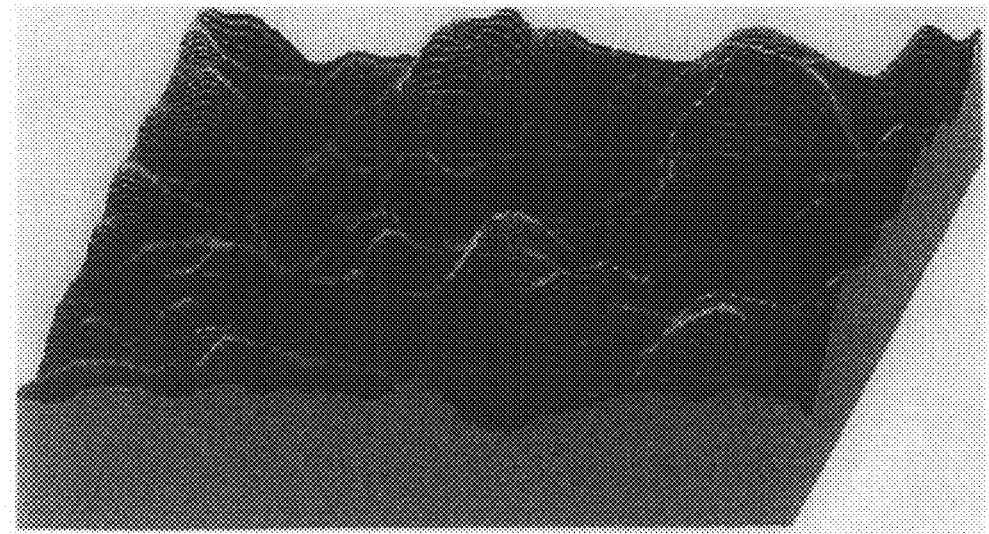
Figure 14A:
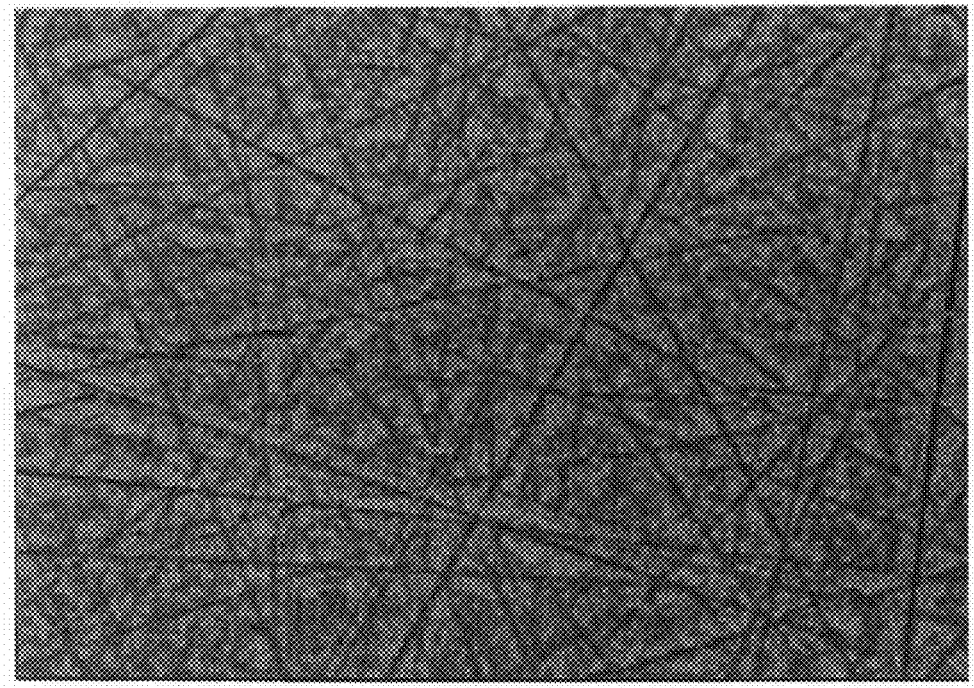
FIG. 14 includes FIGS. 14A and 14B which are respectively an enlarged photograph of a plan view and a diagonal view of the surface of the GaN substrate after the first rough polishing step of Comparison Example 2.
Figure 14B:
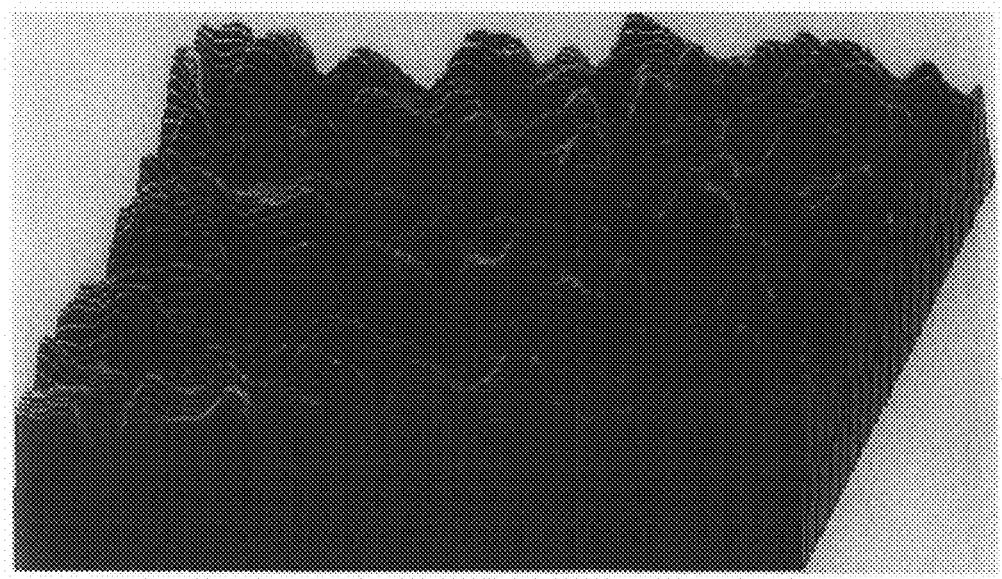
Figure 15A:
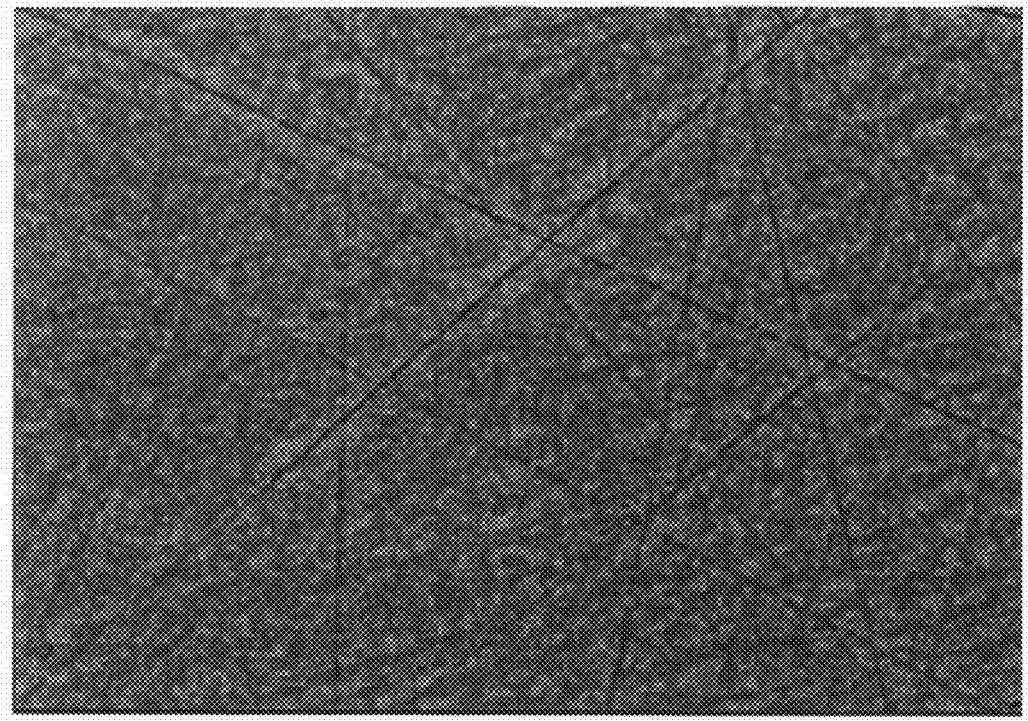
FIG. 15 includes FIGS. 15A and 15B which are respectively an enlarged photograph of a plan view and a diagonal view of the surface of the GaN substrate after the second rough polishing step of Comparison Example 2.
Figure 15B:

Results of a comparison among Test Example 1 and Comparison Examples 1 and 2 are shown in Table 8 below. The surface conditions of the GaN substrate after the first rough polishing step, after the second rough polishing step and after the finishing step in Test Example 1 as described in Table 8 are shown respectively in FIGS. 8, 9 and 10. The surface conditions of the GaN substrate after the first rough polishing step, after the second rough polishing step and after the finishing step in Comparison Example 1 as described in Table 8 are shown respectively in FIGS. 11, 12 and 13. The surface conditions of the GaN substrate after the first rough polishing step, after the second rough polishing step and after the finishing step in Comparison Example 2 as described in Table 8 are shown respectively in FIGS. 14, 15 and 16.

TABLE 8

|  | After first rough polishing step | | After second rough polishing step | | After finishing step | |
| --- | --- | --- | --- | --- | --- | --- |
|  | Ra (nm) | Wa (nm) | Ra (nm) | Wa (nm) | Ra (nm) | Wa (nm) |
| Test Example 1 | 1.10 | 1.00 | 0.48 | 0.44 | 0.15 | 0.08 |
| Comparison Example 1 | 1.10 | 1.20 | 0.46 | 0.40 | 0.28 | 0.17 |
| Comparison Example 2 | 3.15 | 1.56 | 1.02 | 0.94 | 0.47 | 0.15 |

Figure 10A:
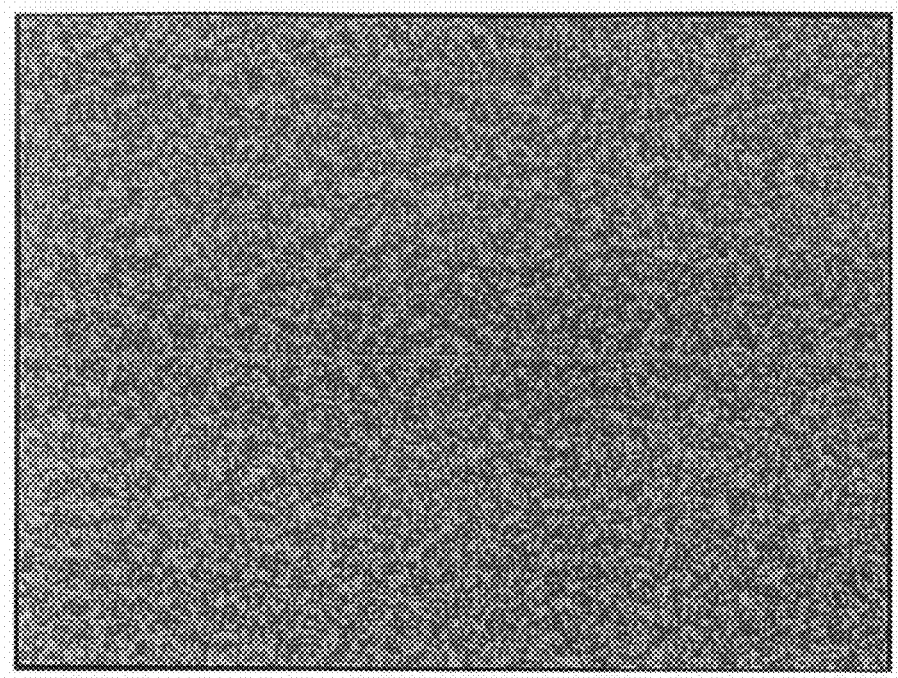
FIG. 10 includes FIGS. 10A and 10B which are respectively an enlarged photograph of a plan view and a diagonal view of the surface of the GaN substrate after the finishing step of Test Example 1.
Figure 10B:
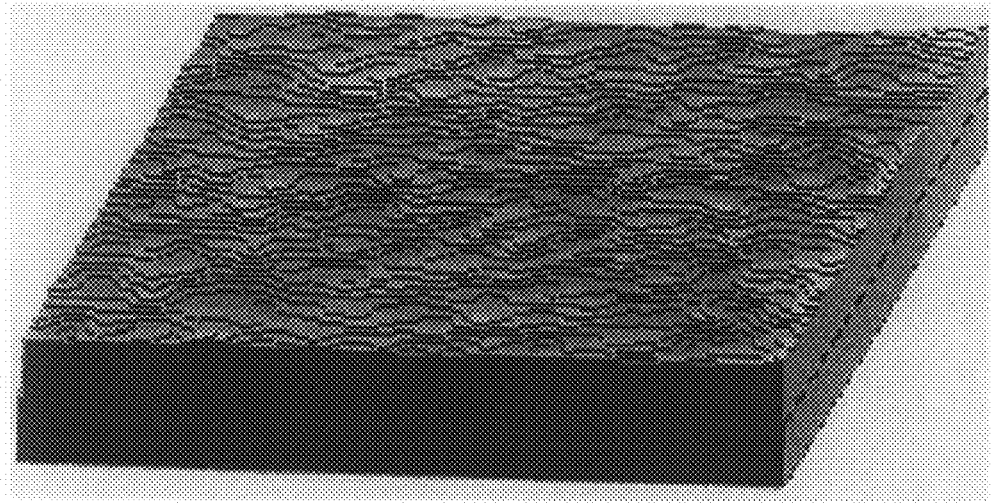
Figure 13A:
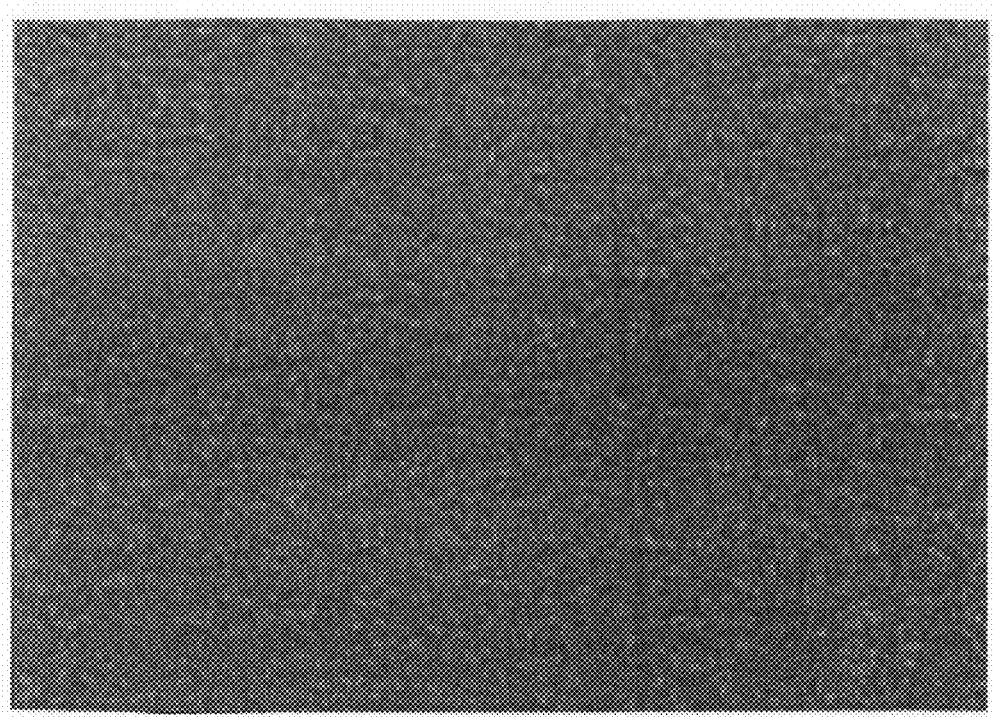
FIG. 13 includes FIGS. 13A and 13B which are respectively an enlarged photograph of a plan view and a diagonal view of the surface of the GaN substrate after the finishing step of Comparison Example 1.
Figure 13B:
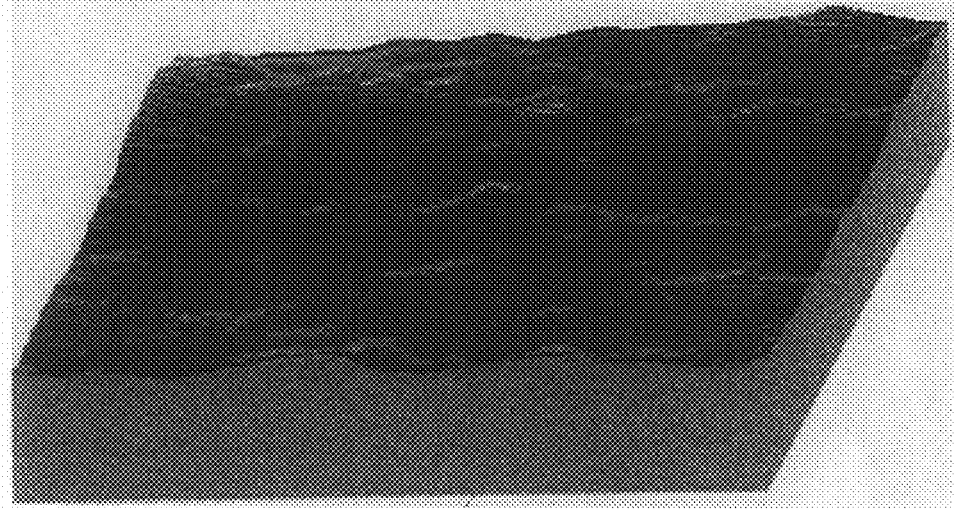
Figure 16A:
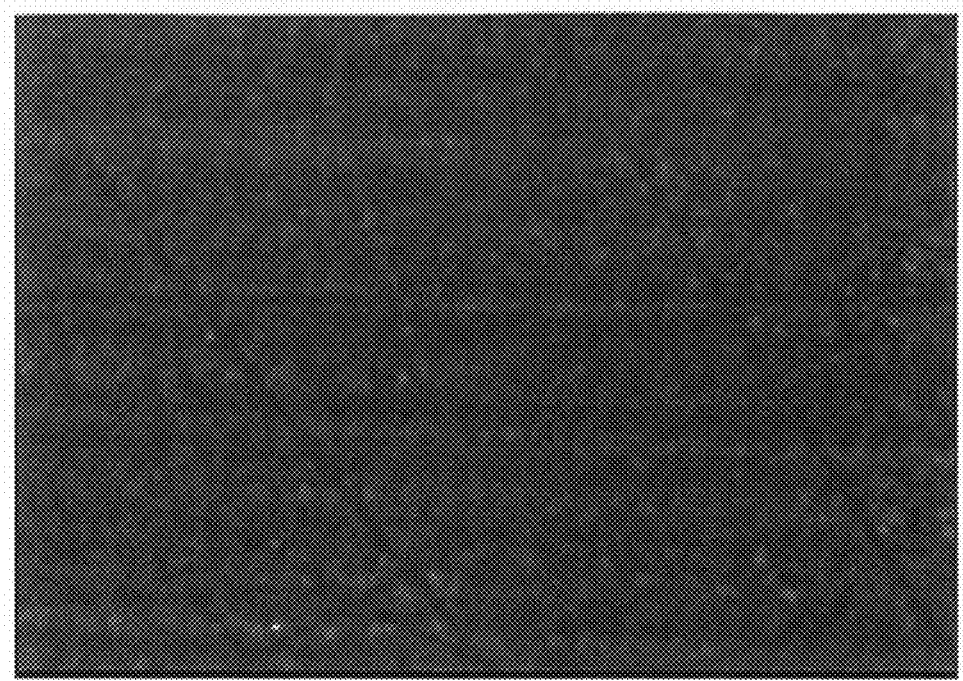
FIG. 16 includes FIGS. 16A and 16B which are respectively an enlarged photograph of a plan view and a diagonal view of the surface of the GaN substrate after the finishing step of Comparison Example 2.
Figure 16B:
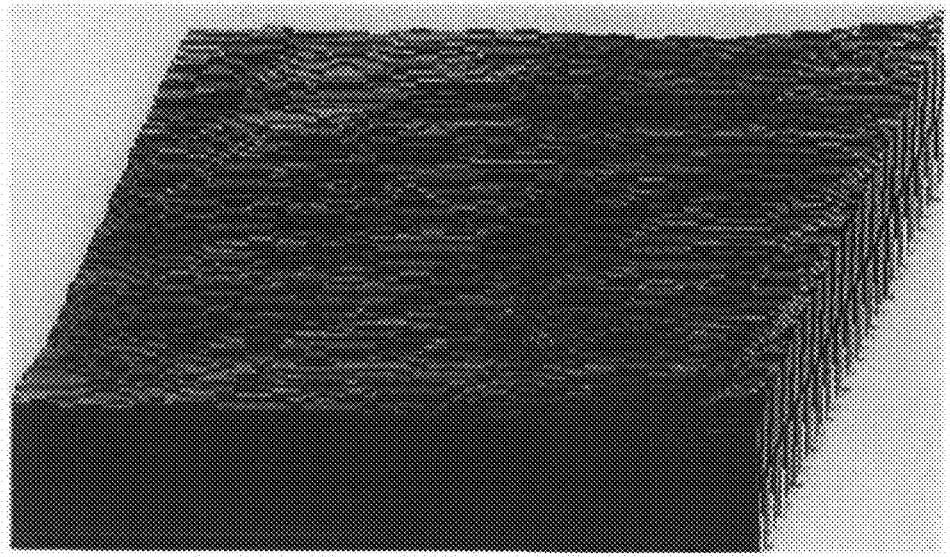

If the conditions after the finishing steps are compared, FIG. 10A shows that no scratches are formed on the surface of the GaN substrate in Test Example 1, while scratches are formed in Comparison Examples 1 and 2, as shown in FIGS. 13A and 16A.

Table 8 also indicates that average surface roughness (Ra) of 0.2 nm or less is possible by Test Example 1 with the surface waviness (Wa) significantly reduced from Comparison Examples 1 and 2. In other words, the surface of a GaN substrate can be polished to be very flat (low in Wa) and very smooth (low in Ra) without scratches formed thereon according to Test Example 1.

TEST EXAMPLE 2

A finishing step was carried out on a SiC substrate of diameter 2 inches by using the polishing oil slurry of Test Example 1 described above.

The first rough polishing step was carried out by the pad-less polishing method as in Test Example 1 under the conditions shown in Table 2. After the first rough polishing step, paraffin hydrocarbons were used to wash away the abrading particles and the GaN substrate was rinsed with alcohols. Thereafter, the average surface roughness (Ra) and the surface waviness (Wa) of the surface of the GaN substrate were measured by means of a commercially available measurement apparatus (Product name: NewView 5000 produced by Zygo Company) under the conditions shown in Table 3 above.

A lapping plate as used in the first rough polishing step of Test Example 1 and the same polishing oil slurry described in Table 4 above were used.

The second rough polishing step was carried out by the pad-less method under the same conditions as described in Table 2 for the second rough polishing step of Test Example 1. After the second rough polishing step, paraffin hydrocarbons were used to wash away the abrading particles and the GaN substrate was rinsed with alcohols. Thereafter, the average surface roughness (Ra) and the surface waviness (Wa) of the surface of the GaN substrate were measured by means of a commercially available measurement apparatus (Product name: NewView 5000 produced by Zygo Company) under the conditions shown in Table 3 above.

A lapping plate as used in the first rough polishing step and the same polishing oil slurry used in the second rough polishing of Test Example 1 described in Table 5 above were used.

The finishing step was carried out also by the pad-less polishing method as in the finishing step of Test Example 1 under the conditions described in Table 2 above. A lapping plate and polishing slurry as used in the finishing step of Test Example 1 were used. After the finishing step, paraffin hydrocarbons were used to wash away the abrading particles and the GaN substrate was rinsed with alcohols. Thereafter, the average surface roughness (Ra) and the surface waviness (Wa) of the surface of the GaN substrate were measured by means of a commercially available measurement apparatus (Product name: NewView 5000 produced by Zygo Company) under the conditions shown in Table 3 above.

Figure 17A:
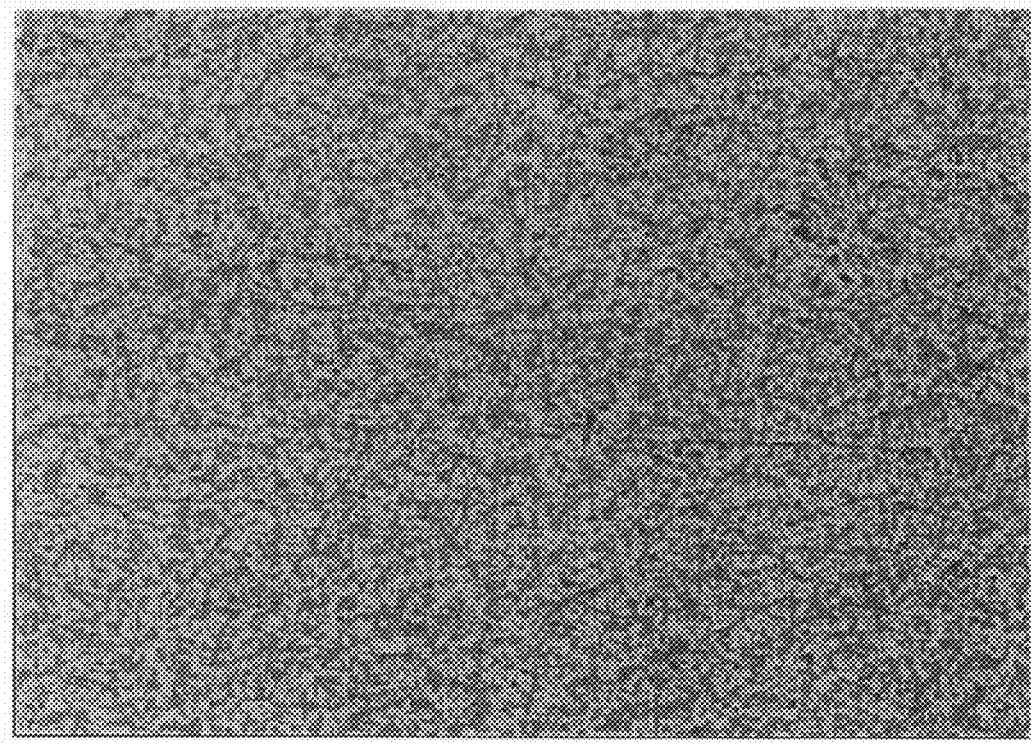
FIG. 17 includes FIGS. 17A and 17B which are respectively an enlarged photograph of a plan view and a diagonal view of the surface of the GaN substrate after the first rough polishing step of Test Example 2.
Figure 17B:
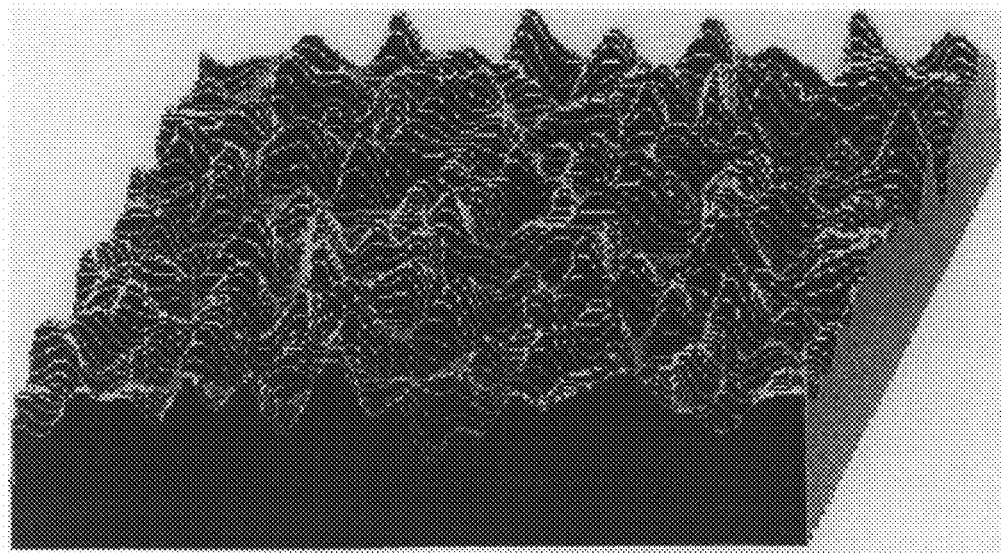
Figure 18A:
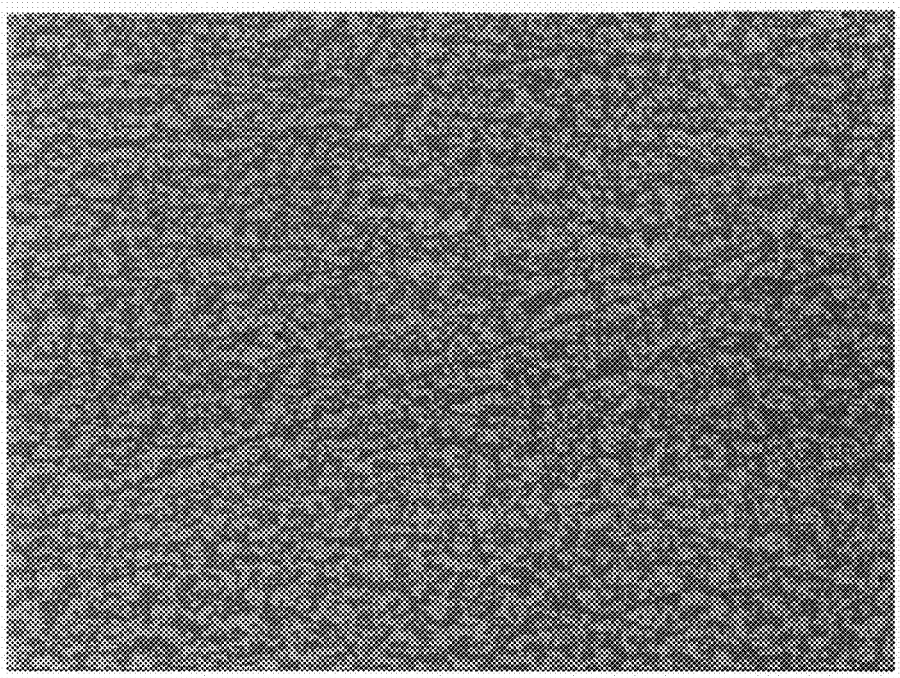
FIG. 18 includes FIGS. 18A and 18B which are respectively an enlarged photograph of a plan view and a diagonal view of the surface of the GaN substrate after the second rough polishing step of Test Example 2.
Figure 18B:
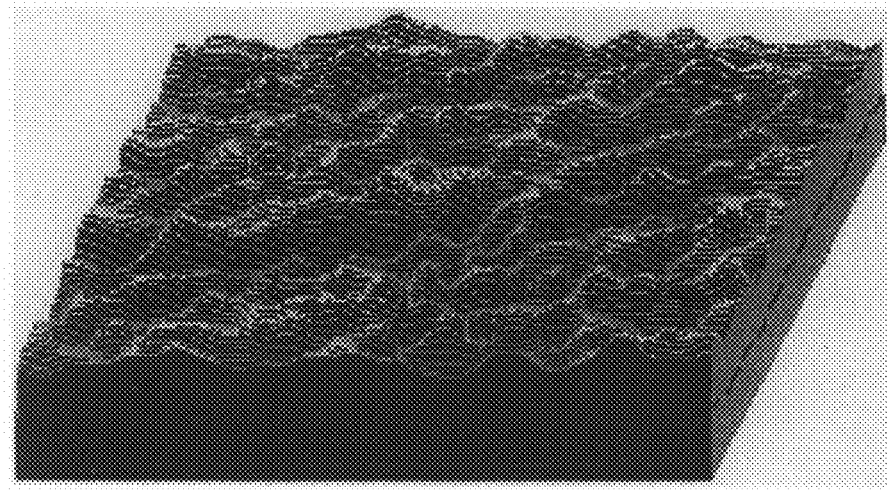
Figure 19A:
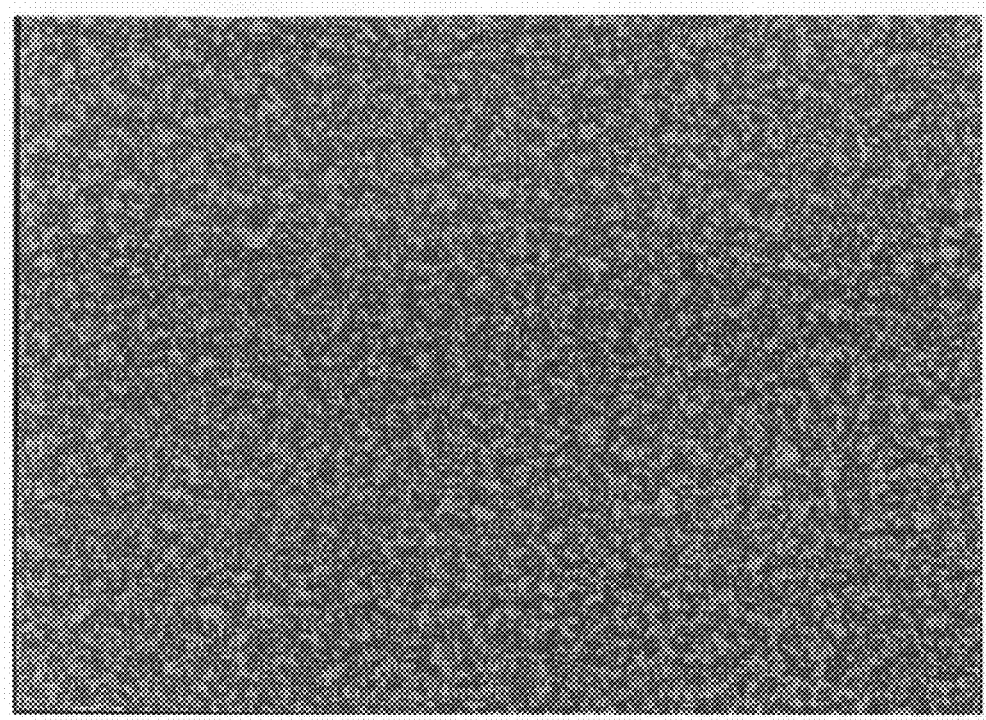
FIG. 19 includes FIGS. 19A and 19B which are respectively an enlarged photograph of a plan view and a diagonal view of the surface of the GaN substrate after the finishing step of Test Example 2.
Figure 19B:
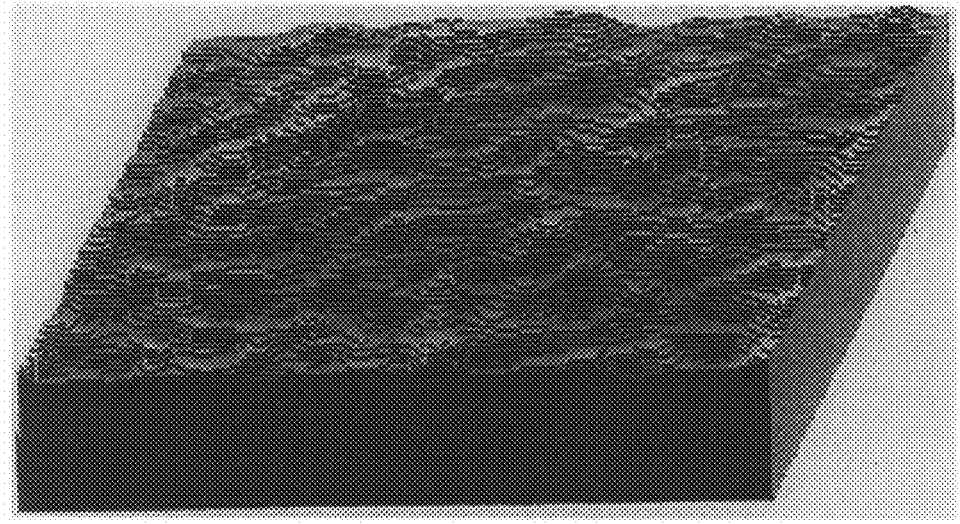

Results of Test Example 2 are shown in Table 9 below. The surface condition of the GaN substrate after the first rough polishing step, after the second rough polishing step and after the finishing step in Test Example 2 as described in Table 9 are shown respectively in FIGS. 17, 18 and 19. FIG. 19A indicates that no scratches are formed on the surface of the SiC according to Test Example 2. Table 9 further indicates that average surface roughness (Ra) of 0.2 nm or less is possible according to Test Example 2 with reduced surface waviness (Wa). In other words, the surface of a SiC substrate can be polished to be very flat (low in Wa) and very smooth (low in Ra) without scratches formed thereon according to Test Example 2.

TABLE 9

|  | After first rough polishing step | | After second rough polishing step | | After finishing step | |
| --- | --- | --- | --- | --- | --- | --- |
|  | Ra (nm) | Wa (nm) | Ra (nm) | Wa (nm) | Ra (nm) | Wa (nm) |
| Test Example 2 | 1.10 | 0.63 | 0.49 | 0.28 | 0.19 | 0.11 |

What is claimed is:

1. A method of polishing a hard crystal substrate, said method comprising:
    a rough polishing process of polishing a surface of said substrate such that said surface comes to have an average surface roughness of 0.5 nm or more and 1 nm or less; and
    a finishing process, carried out after said rough polishing process, of polishing said surface such that the average surface roughness of said surface becomes 0.2 nm or less;
    wherein said finishing process comprises the steps of:
    rotating a lapping plate;
    supplying polishing oil slurry to a surface of said lapping plate;
    pressing the surface of said hard crystal substrate onto the surface of said lapping plate and rotating said hard crystal substrate;
    wherein said polishing oil slurry comprises abrading particles and an oil dispersant that disperses said abrading particles;
    wherein said abrading particles include artificial diamond clusters that comprise approximately spherical agglomerate particles, said agglomerate particles having average particle size D50 of 20 nm or more and 50 nm or less and comprising primary particles diameters of 2 nm or more and 10 nm or less.

2. The method of claim 1 wherein said oil dispersant comprises synthetic isoparaffin hydrocarbons.

3. The method of claim 1 wherein said rough polishing process comprises:
   a first rough polishing step of polishing the surface of said hard crystal substrate such that the average surface roughness of the surface of said hard crystal substrate becomes 1 nm or more and 3 nm or less; and
   a second rough polishing step, carried out after said first rough polishing step, of polishing the surface of said hard crystal substrate such that the average surface roughness of the surface of said hard crystal substrate becomes 0.5 nm or more and 1 nm or less.

4. The method of claim 1 wherein said lapping plate comprises a soft metal and the surface of said lapping plate has a groove formed thereon.

5. The method of claim 4 wherein said soft metal is tin or an alloy of tin.

6. The method of claim 4 wherein said groove is spiral and is centered around the axis of rotation of said lapping plate.

7. The method of claim 4 wherein said groove is sectionally V-shaped.

8. The method of claim 1 wherein said hard crystal substrate is a GaN substrate or a SiC substrate.

* * * * *